United States Patent [19]

Shiga et al.

[11] Patent Number: 5,245,505
[45] Date of Patent: Sep. 14, 1993

[54] CAPACITOR ELEMENT

[75] Inventors: Nobuo Shiga; Kenji Otobe, both of Kanagawa, Japan

[73] Assignee: Sumitomo Electric Industries, Ltd., Osaka, Japan

[21] Appl. No.: 866,452

[22] Filed: Apr. 10, 1992

[30] Foreign Application Priority Data

May 31, 1991 [JP] Japan .................................. 3-129678

[51] Int. Cl.$^5$ ......................... H01G 4/06; H01G 7/00; H01L 29/66
[52] U.S. Cl. .................................. 361/311; 29/25.42; 257/528
[58] Field of Search .................. 357/51; 361/311–313, 361/323; 437/47, 924, 184; 29/25.42

[56] References Cited

U.S. PATENT DOCUMENTS

| | | |
|---|---|---|
| 4,599,678 | 7/1986 | Wertheimer et al. ............... 361/323 |
| 4,924,589 | 5/1990 | Leedy .................................... 29/832 |
| 4,969,032 | 11/1990 | Scheitlin et al. . | |
| 5,105,255 | 4/1992 | Shannon et al. ...................... 357/68 |

FOREIGN PATENT DOCUMENTS

| | | | |
|---|---|---|---|
| 0361900 | 4/1990 | European Pat. Off. . | |
| 97854 | 6/1983 | Japan ................................... 357/51 |
| 152051 | 8/1985 | Japan ................................... 357/51 |
| 125654 | 5/1990 | Japan ................................... 357/51 |

OTHER PUBLICATIONS

Patent Abstracts of Japan vol. 15, No. 219 (E-107) Jun. 5, 1991.
Patent Abstracts of Japan vol. 15, No. 288 (9E-109) Jul. 22, 1991.
Patent Abstracts of Japan vol. 15, No. 334 (E-110) Aug. 26, 1991.
Patent Abstracts of Japan vol. 10, No. 79 (E-391) (2136) Mar. 28, 1986.
Patent Abstracts of Japan vol. 13, No. 445 (E-829) (3743) Oct. 6, 1989.

*Primary Examiner*—Donald A. Griffin
*Attorney, Agent, or Firm*—Cushman, Darby & Cushman

[57] ABSTRACT

A capacitance element for use in a high frequency signal processing circuit including a first-layer conductor formed on a substrate, a plurality of rod-like conductors arranged upright on the first-layer conductor, an inter-layer insulating film formed so as to cover the surfaces of the first-layer conductor and the rod-like conductors, and a second-layer conductor formed on the inter-layer insulating film at a position where the second-layer conductor superimposes on the first-layer conductor and the rod-like conductors. The opposite area of the electrodes increases by the areas of the side surfaces of the rod-like conductors so that it is possible to expect an increase of the capacity per unit area.

9 Claims, 1 Drawing Sheet

CAPACITOR ELEMENT

BACKGROUND OF THE INVENTION

The present invention relates to the structure of a capacitor element such as might be used for blocking (shunting) or passing a high frequency signal or for constituting a filter in combination with an inductance element and/or a resistor element, in a microwave integrated circuit for use for processing a high frequency signal of from several hundreds MHz to several tens GHz.

With rapid advances in the development of an information network systems, satellite communication systems in a high frequency band are becoming more popular. As a result, a high-frequency field-effect transistor, a Schottky barrier type field-effect transistor (MESFET) using a compound semiconductor such as a GaAs semiconductor or the like is being used more and more. Recently, in order to reduce the size and cost of a system for such communication and in order to improve system performance, a first-stage amplifier portion of a down converter for converting a high-frequency signal into a low-frequency signal has been developed and fabricated into an integrated circuit (MMIC: monolithic microwave integrated circuit). The MMIC provides a communication device replacing one previously constituted by a large number of separate elements. The use of such a MMIC reduces the number of parts needed, the mounting costs, and improves reliability by the reduction in the number of connection points required by the circuit. Compared with prior devices using a large number of separate elements, reduction in cost can be easily achieved by mass production.

A MMIC having numerous capacitor elements in a circuit requires making a complex circuit layout on a plane, thus, making the circuit difficult to produce. In a MMIC to be used at frequencies not lower than about 100 GHz, a distributed constant line element such as a micro strip line, or the like is used, but there is a tendency for the area of the strip line to become large. This tendency becomes significant in a MMIC for use at frequencies lower than 100 GHz. As the size of a MMIC chip becomes large, production yield becomes low and the number of chips which can be obtained from one substrate becomes relatively smaller, thus, increasing the cost per chip. To help overcome this problem, a parallel plate capacitor is used which is constituted by a square-shaped conductor, with each side about several tens $\mu$m to about several hundreds $\mu$m long, formed in a first wiring layer and another conductor formed in a second wiring layer. An inter-layer insulating film is interposed between the first and second layers so as to form a sandwich shape, that is, a MIM (Metal-Insulation-Metal) capacitor.

In such a MIMC, however, it is typical that only two wiring layers are used, and it is therefore impossible to use a lamination miniaturizing technique which is applied to an individual element capacitor. The only way to reduce size would be to reduce the thickness of the inter-layer insulating film or use material having a specific inductive capacity $\epsilon$ as the inter-layer insulating film. However, if the thickness of the inter-layer insulating film is too thin, a short circuit may be generated due to flaws in the laminate which lowers the yield, therefore, the thickness is limited to approximately 0.2 $\mu$m. Further, only certain materials can be used as the inter-layer insulating film at such thicknesses. Therefore, $Si_3N_4$ or SiON having $\epsilon=7$ are the preferred materials since they have large specific inductive capacities.

SUMMARY OF THE INVENTION

It is an object of the present invention to provide a capacitor element which overcomes the problems stated above. In accordance with the principles of the present invention a capacitor element is provided with a first-layer conductor formed on a substrate, a plurality of rod-like conductors arranged on the first-layer conductor, an inter-layer insulating film formed so as to cover the surfaces of the first-layer conductor and the rod-like conductors; and a second-layer conductor formed on the inter-layer insulating film at a position where the second-layer conductor superimposes on the first-layer conductor and the rod-like conductors.

The capacitance of the capacitor element according to the present invention can be calculated substantially in the same manner as an ordinary parallel plate capacitor. That is, let the respective values of the area, the thickness of the inter-layer insulating film, the specific inductive capacity of the inter-layer insulating film, and the vacuum dielectric constant be $S_1$, $d_1$, $\epsilon$, and $\epsilon_0$ respectively, then, the capacitance $C_1$ of a parallel plate capacitor is expressed as follows.

$$C_1 = \epsilon_0 \epsilon S_1 / d_1 \tag{1}$$

Taking the rod-like conductors on the first wiring layer into consideration, the area of the parallel plate capacitor increases by the area of the side surfaces of the rod like conductors. Accordingly, assume that each rod-like conductor is a quadrangular prism, and let the respective lengths of the long and short sides of the bottom, the height, and the number of the rod-like conductors be $l_1$ and $l_2$, $h_1$, and $n_1$ respectively. Then, the total area increases by $$2(l_1 + l_2) h_1 n_1 \tag{2}$$

and the capacitance becomes $$C_1 = \epsilon_0 \epsilon (S_1 + 2(l_1 + l_2) h_1 n_1) / d_1 \tag{3}$$

DETAILED DESCRIPTION OF THE INVENTION

Figure 1:
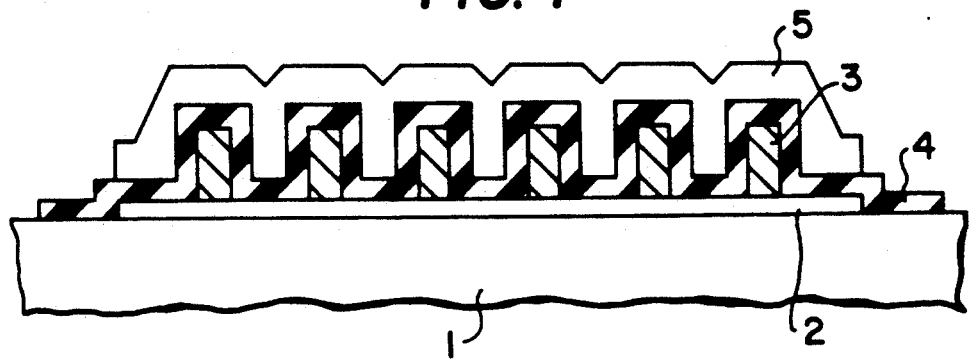
FIG. 1 is a sectional view showing an embodiment of the present invention.
Figure 2:
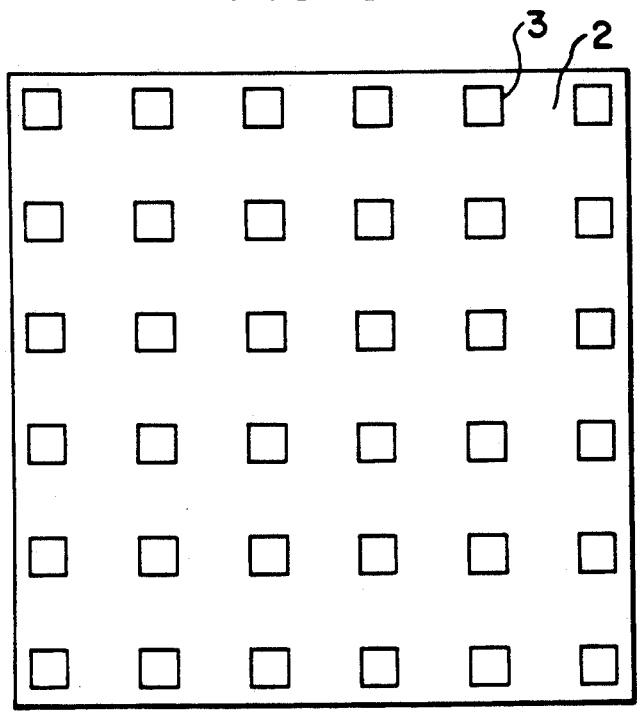
FIG. 2 is a plan view showing a state in the way of producing process of the embodiment.

As shown in the Figures, a first-layer conductor 2 having a square shape is formed on a GaAs substrate 1 which is a semiconductor substrate of a semi-insulative compound. Then, rod-like conductors 3 having a square bottom surface with each side about 1 $\mu$m to several $\mu$m long are formed periodically at intervals of about 1 $\mu$m to several $\mu$m, by a method such as plating or the like, as shown in FIG. 2. Next, an inter-layer insulating film 4 is formed generally to a thickness of 2000 angstroms to 5000 angstroms by using a material such as $Si_3N_4$, SiON or the like. It is necessary that the thickness of the inter-layer insulating film 4 is made thin to an extent that rod-like conductors are not buried. Thereafter, a second-layer conductor 5 is formed. The metal material used for the first and second conductors 2 and 5 is Ti/Au, Ti/Pt/Au or the like. A photoresist is used for patterning at the time of forming the rod-like conductors 3. By suitably selecting the kind of the photoresist and the conditions of coating, it is possible to make a coating to a thickness of about 20 μm and it is possible to perform exposure and development. It is very easy to form such a thick metal by a method such as plating or the like. Although it is important to uniformly deposit the inter-layer insulating film 4 on the side surfaces of the rod-like conductors 3, the deposition can be easily attained by suitably selecting the conditions of deposition of the film. It is better to make the height of the rod-like conductors 3 higher in view of the capacitance per unit area. However, if the rod-like conductors are selected to be too high, it is necessary to deposit considerably thick metal at the time of forming the second-layer conductor and it becomes impossible to use a plating method. Accordingly, it becomes necessary to employ sputtering or evaporation in place of plating, so that the producing time is greatly prolonged.

Next, in order to prove the effect of the present invention, an example of calculation of the capacitance will be shown below. Assume that the size of a MIM capacitor according to the conventional art is 200μm×200μm, that is, the area $S_1 = 40000\mu^2$, the thickness of the inter-layer insulating film $d_1 = 0.2$ μm, and the specific inductive capacity of the inter-layer insulating film $\epsilon = 7$. Then, the capacitance $C_0$ is as follows.

$$C_0 = 8.854 \times 10^{-12} \times 7 \times 40000 \times 10^{-12}/(0.2 \times 10^{-6}) \quad (1)$$
$$= 12 \ (pF)$$

On the other hand, if the rod-like conductors 3 each having a size of 5 μm×5 μm and a height of 10 μm are formed at intervals of 15 μm lengthwise and crosswise on the first-layer conductor of 200 μm×200 μm as an example of the embodiment, the number of the formed rod-like conductors 3 is 10×10=100 and the total area increases by the areas of the side surfaces of the rod-like conductors 3, that is, 4×5 μm×10 μm×200=20000 μm², so that the capacitance $C_1$ thereof becomes as follows.

$$C_1 = 8.854 \times 10^{-12} \times 7 \times 60000 \times 10^{-12}/(0.2 \times 10^{-6}) \quad (1)$$
$$= 18 \ (pF)$$

It is understood that the capacitance becomes 1.5 times while keeping the area equal in plan.

It is possible to substantially widen the opposite area of the electrodes without changing the area viewed in plan, by using rod-like conductors and it is therefore possible to increase the capacitance per unit area. In other words, the size for obtaining a predetermined capacitance value can be reduced, such that it is smaller than that of the conventional MIM capacitor.

While the invention has been described in connection with what is presently considered to be the most practical and preferred embodiment, it is understood that the invention is not limited to the disclosed embodiment, but, on the contrary, is intended to cover various modifications and equivalent arrangements included within the spirit of the appended claims.

What is claimed is:

1. A capacitor element comprising:
   a first-layer metal conductor formed on a substrate;
   a plurality to rod-like metal conductors disposed on said first-layer conductor;
   an inter-layer insulating film formed so as to cover a surface of said first-layer conductor and a surface of said rod-like conductors; and
   a second-layer metal conductor formed on said inter-layer insulating film at a position where said second-layer conductor superimposes on said first-layer conductor and said rod-like conductors.

2. A capacitor element as claimed in claim 1, wherein said rod-like conductors have a square bottom surface.

3. A capacitor element as claimed in claim 1, wherein said inter-layer insulating film has a thickness not less than 2000 angstroms and not more than 5000 angstroms.

4. A capacitor element as claimed in claim 1, wherein said first-layer conductor and said second-layer conductor are composed of Ti/Au.

5. A capacitor element as claimed in claim 1, wherein said first-layer conductor and said second-layer conductor are composed of Ti/Pt/Au.

6. A capacitor element as claimed in claim 1, wherein said inter-layer insulating film is composed of $Si_3N_4$.

7. A capacitor element as claimed in claim 1, wherein said inter-layer insulating film is composed of SiON.

8. A capacitor element as claimed in claim 1, wherein said rod-like conductors have a height approximately equal to 10 micrometers.

9. A method of manufacturing a capacitor element comprising the steps of:
   forming a first-layer metal conductor on a substrate;
   forming a plurality of rod-like metal conductors on said first-layer conductor;
   forming an inter-layer insulating film to a thickness not less than 2000 angstroms and not more than 5000 angstroms so as to cover a surface of said first-layer conductor and a surface of said rod-like conductors; and
   forming a second layer metal conductor on said inter-layer insulating film at a position where said second-layer conductor superimposes on said first-layer conductor and said rod-like conductors.

* * * * *